United States Patent [19]

van Beijnen

[11] 3,945,859

[45] Mar. 23, 1976

[54] METHOD OF MANUFACTURING SUPERCONDUCTORS OF β-TUNGSTEN STRUCTURE

[75] Inventor: Christianus Antonius Maria van Beijnen, Alkmaar, Netherlands

[73] Assignee: Reactor Centrum Nederland (Stichting), The Hague, Netherlands

[22] Filed: Mar. 22, 1974

[21] Appl. No.: 453,938

[30] Foreign Application Priority Data
Apr. 17, 1973 Netherlands.................. 7305400

[52] U.S. Cl............................. 148/11.5 R; 29/599
[51] Int. Cl.²...................................... H01L 39/24
[58] Field of Search................ 148/11.5 R; 29/599

[56] References Cited

UNITED STATES PATENTS

| | | | |
|---|---|---|---|
| 3,541,680 | 11/1970 | Verrijp | 29/599 |
| 3,623,221 | 11/1971 | Morton et al. | 29/599 |
| 3,625,662 | 12/1971 | Roberts et al. | 29/599 |

*Primary Examiner*—W. Stallard
*Attorney, Agent, or Firm*—Stewart and Kolasch, Ltd.

[57] ABSTRACT

A method of manufacturing a superconductor consisting of different materials by introducing into material of an element or an alloy at least one element of another group or a compound, whereupon the diameter of the assembly, if desired, is reduced and subsequently a superconductive layer of said elements is formed by thermal treatment.

14 Claims, No Drawings

METHOD OF MANUFACTURING SUPERCONDUCTORS OF $\beta$-TUNGSTEN STRUCTURE

BACKGROUND AND SUMMARY OF THE INVENTION

The present invention relates to a method of manufacturing a superconductor consisting of different materials. German Patent Application No. 1,234,939 discloses a manufacture of superconductors by mixing vanadium powder and $V_2Ga_5$ powder in accordance with the reaction: $13V + V_2Ga_5 \rightarrow 5V_3Ga$. A disadvantage of this method of manufacturing a superconductor resides in that the final product becomes porous. Moreover, this method is not suitable for manufacturing filamentary superconductors.

According to the present invention these disadvantages can be obviated by introducing into a piece of material of an element or an alloy of this element selected from the group of V-B at least one element selected from the group IIIA or IVA or a compound of the element of the group VB with at least one element of said other groups or a mixture of such a compound with an element of the groups IIIA or IVA of the Periodic System, by reducing, if desired, the diameter of the assembly and by subsequently forming a superconductive layer of these elements by a thermal treatment, the second of said compounds having such a deficiency of the element of the group V-B that for the formation of the superconductive layer material from the first-mentioned piece is used.

There may be added an accelerator to the introduced material. The introduced material may be compact, powdery or a mixture of powders or of a powder and a compact material. The method according to the invention is particularly effective when the first piece of material is vanadium and the introduced material is $V_2Ga$.

During the formation of the $V_2Ga_5$ the 13 vanadium atoms required for each $V_2Ga_5$ molecule are provided by the piece of vanadium so that an uninterrupted $V_3Ga$ layer is formed. The thickness of said layer may be about 10 $\mu$. The thermal treatment is carried out at about 600°C for 150 hours.

Other examples are the formation of $Nb_3Al$, $V_3Si$, $Nb_3Sn$, $Nb_{3.76}(Al_{0.73}Ge_{0.27})$. For the formation of $Nb_3Al$, for example, a piece of compact aluminium is introduced into a sheath of Nb. When forming $V_3Si$ a pulverulent Si can be introduced into a sheath of vanadium, whilst it is also possible to introduce pulverulent Si with pulverulent $VSi_2$.

When forming $Nb_{3.76}(Al_{0.73}Ge_{0.27})$, for example, aluminium and germanium powder or compact aluminium and powdery germanium may be introduced into an Nb cylinder.

As an alternative, $NbAl_3$ powder with $NbGe_2$ powder or $NbAl_3$ powder and germanium powder or compact aluminium with $NbGe_2$ powder may be introduced.

What I claim is:

1. A method of manufacturing a superconductor consisting of different materials which comprises introducing into a first component selected from the elements or alloys of the elements of Group VB of the Periodic Table, a second component containing an accelerator and consisting essentially of an element selected from the Group consisting of Group IIIA and Group IVA of the Periodic Table, or a second component containing an accelerator and consisting essentially of a mixture of (1) a compound or alloy of a Group VB element with an element selected from the Group consisting of Group IIIA and Group IVA of the Periodic Table with (2) an element selected from the Group consisting of Group IIIA and Group IVA of the Periodic Table, and thermally treating said materials to produce a superconductor having a superconductive boundary layer.

2. The method of claim 1, wherein the second component is in the form of a powder.

3. The method of claim 1, wherein the second component is in a compact state.

4. The method of claim 1, wherein at least one of the elements or compounds has the form of a powder and at least one of the elements is in a compact state.

5. The method of claim 1, wherein the first component is vanadium and the second component is gallium.

6. The method of claim 1, wherein the first component is vanadium and the second component is a mixture of gallium and $V_2Ga_5$.

7. The method of claim 1, wherein the thickness of the superconductive boundary layer is about 10 microns.

8. The method of claim 1, wherein the first and second components are inserted into at least hole provided in a bar of a conductive metal.

9. The method of claim 1, wherein the Group VB element in the first and second component are the same.

10. The method of claim 1, wherein the superconducting boundary layer is $V_3Ga$.

11. The method of claim 1, wherein the superconductor is in the form of at least one wire, the diameter of the wire being reduced before the thermal treatment.

12. The method of claim 1, wherein the second component has such a deficiency of the Group VB element that the Group VB element of the first component is used for the formation of the superconductive layer.

13. The method of claim 1, wherein the superconductor is selected from the Group consisting of $Nb_3Sn$, $Nb_3Al$, $Nb_3Ga$, $Nb_{3.67}(Al_{0.73}Ge_{0.27})$ and $V_3Si$.

14. A superconductor manufactured by the method of claim 8.

* * * * *